(12) United States Patent
Lo

(10) Patent No.: US 8,294,437 B1
(45) Date of Patent: Oct. 23, 2012

(54) POWER MANAGEMENT DEVICE

(75) Inventor: Wen-Hsin Lo, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 35 days.

(21) Appl. No.: 13/116,004

(22) Filed: May 26, 2011

(30) Foreign Application Priority Data

Mar. 31, 2011 (CN) .......................... 2011 1 0080362

(51) Int. Cl.
*G05F 1/10* (2006.01)
*H02J 3/12* (2006.01)
(52) U.S. Cl. ........................................ 323/234; 326/52
(58) Field of Classification Search .................. None
See application file for complete search history.

(56) References Cited

U.S. PATENT DOCUMENTS

| | | | |
|---|---|---|---|
| 6,677,710 B2 * | 1/2004 | Weedon | 315/77 |
| 7,212,021 B2 * | 5/2007 | Karnik et al. | 324/762.02 |
| 7,667,545 B2 * | 2/2010 | Schlueter et al. | 331/14 |
| 2005/0134250 A1 * | 6/2005 | Kim et al. | 323/299 |

* cited by examiner

*Primary Examiner* — Crystal L Hammond
(74) *Attorney, Agent, or Firm* — Altis Law Group, Inc.

(57) ABSTRACT

A power management device for controlling a power supply device includes a pulse generator, a delay unit, a first XOR gate, an OR gate, and a second XOR gate. The pulse generator generates a pulse signal, the delay unit, the first XOR gate, the OR gate, and the second XOR gate cooperatively generate an enabling signal corresponding to the pulse signal to enable and disable the power supply, and receive an output voltage of the power supply device as a feedback signal. Upon receiving the feedback signal, the power management device can stay at correct enabled and disabled statuses of the power supply device.

14 Claims, 2 Drawing Sheets

POWER MANAGEMENT DEVICE

BACKGROUND

1. Technical Field

The present disclosure relates to power management devices, and particularly to a mechanical power management device.

2. Description of Related Art

Many electronic devices, such as set-up boxes (STBs), use microcontrollers (MCUs) for power management. However, using MCUs to switch electronic devices on and off requires the installation of special control programs in the MCUs, which occupies system resources of the electronic devices. Therefore, mechanical switch devices are also widely used to switch the electronic devices on and off for conserving system resources of the electronic devices.

Mechanical switch devices generally include XOR gates. When an XOR gate is used in such a mechanical power management device, an output end of the XOR gate is connected to a control end of a power supply, one input end of the XOR gate is connected to a working voltage source through a switch, and the other input end of the XOR gate is connected to an output end of the power supply that is used to supply electric power to an electronic device.

When the electronic device is off, the switch is disconnected, and the two input ends and the output end of the XOR gate are all logic 0. To turn the electronic device on, the switch is operated to electrically connect the working voltage source to the input end of the XOR gate connected to the switch for a short time and then disconnect. Thus, the input end of the XOR gate connected to the switch is temporarily changed to be logic 1 by a working voltage. When the two input ends of the XOR gate are respectively logic 1 and logic 0, the output end of the XOR gate becomes logic 1. The logic 1 generated on the output end of the XOR gate controls the power supply to supply power to the electronic device, such that the electronic device is switched on, and the input end of the XOR gate connected to the output end of the power supply is also changed to logic 1. Because the switch only connects the working voltage source to the input end of the XOR gate for a short time and quickly disconnects, the input end of the XOR gate connected to the switch quickly returns to logic 0. Thus, the two input ends of the XOR gate are respectively logic 1 and logic 0, and the output end of the XOR gate stays at logic 1, such that the power supply is controlled to continuously supply power to the electronic device.

When the electronic device has already been switched on, and the switch is operated to electrically connect the working voltage source to the input end of the XOR gate connected to the switch for a short time and then quickly disconnect again, both the two input ends of the XOR gate become logic 1, and thus the output end of the XOR gate becomes logic 0. The logic 0 generated on the output end of the XOR gate prohibits the power supply supplying power to the electronic device, such that the electronic device is switched off and the input end of the XOR gate connected to the output end of the power supply returns to logic 0. When the switch disconnects and the input end of the XOR gate connected to the switch returns to logic 0, all of the two input ends and the output end of the XOR gate return to logic 0, and the electronic device remains off. In this way, operations applied to the switch can alternately switch the electronic device on and off, without using any software.

However, if the switch has already electrically connected the working voltage source to the input end of the XOR gate and does not quickly disconnect (e.g., due to being worn out, or errors in operations), the input end of the XOR gate connected to the switch will stay at logic 1 even when the input end of the XOR gate connected to the output end of the power supply has already become logic 1. In this situation, if the electronic device has been switched on by the electric connection between the working voltage source and the input end of the XOR gate, both the two input ends of the XOR gate being logic 1 makes the output end of the XOR gate to be logic 0, and the electronic device will be mistakenly switched off. If the electronic device has been switched off by the electric connection between the working voltage source and the input end of the XOR gate, the two input ends of the XOR gate being respectively logic 1 and logic 0 makes the output end of the XOR gate to be logic 1, and the electronic device will be mistakenly switched on.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figures.

DETAILED DESCRIPTION

Figure 1:
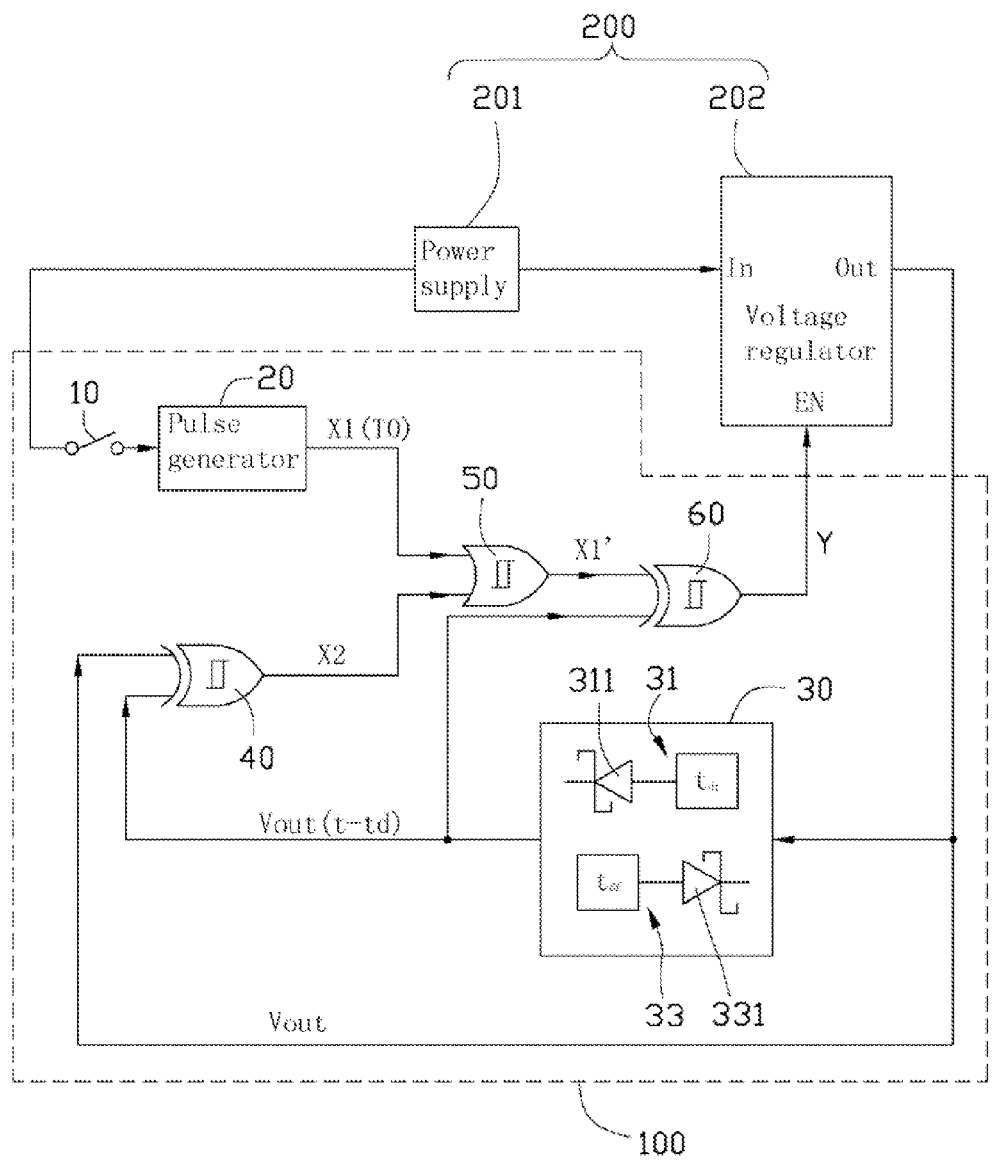
FIG. 1 is a circuit diagram of a power management device, according to an exemplary embodiment, connected to a power supply device.

FIG. 1 shows a circuit diagram of a power management device 100, according to an exemplary embodiment, connected to a common power supply device 200. The power management device 100 can control the power supply device 200 to supply power to electronic devices, such as set-top boxes (STBs).

The power supply device 200 includes a power supply 201 and a voltage regulator 202. The power supply 201 is connected to the voltage regulator 202, and can output power to the voltage regulator 202. The power management device 100 is connected to the voltage regulator 202, and can control the voltage regulator 202 to regulate the voltage of the power supplied by the power supply 201 to predetermined values and provide the regulated voltage to electronic devices. In this embodiment, the voltage regulator 202 includes an input pin In, an output pin Out, and an enabling pin EN. The Input pin In is connected to the power supply 201 to receive power from the power supply 201. The enabling pin EN is connected to the power management device 100, such that the power management device 100 can control the voltage regulator 202 through the enabling pin EN. The output pin Out is used to output regulated voltage to electronic devices (not shown). Furthermore, the output pin Out is also connected to the power management device 100 to provide an output voltage of the voltage regulator 202 to the power management device 100 as a feedback signal.

The power management device 100 includes a switch 10, a pulse generator 20, a delay unit 30, a first logic gate 40, a second logic gate 50, and a third logic gate 60. Two ends of the switch 10 are respectively connected to the power supply 201 and the pulse generator 20, such that the power supply 201 can provide a working voltage to the pulse generator 20 through the switch 10. Additionally, the pulse generator 20 can also be connected to other typical power supplies (not shown) through the switch 10 to receive working voltages. In this embodiment, when the switch 10 connects the pulse generator 20 to the power supply 201, the pulse generator 20 receives a working voltage from the power supply 201 and correspondingly outputs a pulse signal X1(T0), wherein T0 is the value of a pulse width of the pulse signal X1(T0).

The first logic gate 40 is an XOR gate. The output end Out of the voltage regulator 202 is connected to one input end of the first logic gate 40, and is also connected to the delay unit 30. The delay unit 30 is connected to the other input end of the first logic gate 40. When the voltage regulator 202 is enabled, it receives the voltage from the power supply 201 and transforms the received voltage into an output voltage Vout at the output end Out. The output voltage Vout can be used to supply power to electronic devices. Furthermore, both the input end of the first logic gate 40, which is directly connected to the output end Out, and the delay unit 30 receive the output voltage Vout. The delay unit 30 delays the output voltage Vout and correspondingly generates a delay voltage Vout(t−td). The input end of the first logic gate 40 connected to the delay unit 30 receives the delay voltage Vout(t−td). Thus, the output voltage Vout and the delay voltage Vout(t−td) cooperatively generate a first control signal X2 at an output end of the first logic gate 40. The logic relationship between the output voltage Vout, the delay voltage Vout(t−td), and the first control signal X2 is: X2=Vout⊕Vout(t−td).

The delay unit 30 includes a switch-on delay module 31, a switch-off delay module 33, a first diode 311, and a second diode 331. The output end Out of the voltage regulator 202 is connected to an anode of the first diode 311 through the switch-on delay module 31, and a cathode of the first diode 311 is connected to the input end of the first logic gate 40 that is connected to the delay unit 30. The output end Out of the voltage regulator 202 is also connected to a cathode of the second diode 331, and an anode of the second diode 331 is connected to the input end of the first logic gate 40 that is connected to the delay unit 30 through the switch-off delay module 33. When the voltage regulator 202 is enabled, the output voltage Vout is first delayed by the switch-on delay module 31, and then drives the first diode 311 to be switched on and generates the delay voltage Vout(t−td) on the input end of the first logic gate 40. Thus, the value of the delay voltage Vout(t−td) increases more slowly than the value of the output voltage Vout. When the voltage regulator 202 is disabled, the out voltage Vout becomes logic 0. The delay voltage Vout(t−td) on the input end of the first logic gate 40 that is connected to the delay unit 30 is first delayed by the switch-off delay module 33, and then drives the second diode 331 to be switched on and is transmitted to the output end Out (i.e., logic 0) to be canceled. Thus, the value of the delay voltage Vout(t−td) decreases more slowly than the value of the output voltage Vout.

The second logic gate 50 is an OR gate. Two input ends of the second logic gate 50 are respectively connected to the pulse generator 20 and the output end of the first logic gate 40 to receive the pulse signal X1(T0) and the first control signal X2. Upon receiving the pulse signal X1(T0) and the first control signal X2, the second logic gate 50 correspondingly generates a second control signal X1' at an output end thereof. The logic relationship between the second control signal X1', the pulse signal X1(T0), and the first control signal X2 is: X1'=X1(T0)+X2.

The third logic gate 60 is an XOR gate. An output end of the third logic gate 60 is connected to the enabling pin EN of the voltage regulator 202. Two input ends of the third logic gate 60 are respectively connected to the output end of the second logic gate 50 and the delay unit 30 to receive the second control signal X1' and the delay voltage Vout(t−td). Upon receiving the second control signal X1' and the delay voltage Vout(t−td), the third logic gate 60 correspondingly generates an enabling signal Y at the output end thereof. The logic relationship between the enabling signal Y, the second control signal X1', and the delay voltage Vout(t−td) is: Y=X1'⊕Vout(t−td). The enabling signal Y is transmitted to the voltage regulator 202 to control the voltage regulator 202. In this embodiment, when the voltage of the enabling signal Y is logic 1, the voltage regulator 202 is enabled. When the voltage of the enabling signal Y is logic 0, the voltage regulator 202 is disabled.

Furthermore, in this embodiment, when the output voltage Vout and the delay voltage Vout(t−td) are used as logic input voltages of the power management device 100 (i.e., when the output voltage Vout is input to the first logic gate 40, and the delay voltage Vout(t−td) is input to the first logic gate 40 and the third logic gate 60), the logic values of the output voltage Vout and the delay voltage Vout(t−td) are determined according to this method: when the values of the output voltage Vout and the delay voltage Vout(t−td) are greater than a predetermined switch-on value VIH, the output voltage Vout and the delay voltage Vout(t−td) are identified as logic 1; when the values of the output voltage Vout and the delay voltage Vout(t−td) are less than a predetermined switch-off value VIL, the output voltage Vout and the delay voltage Vout(t−td) are identified as logic 0. The switch-off value VIL is less than the switch-on value VIH.

Figure 2:
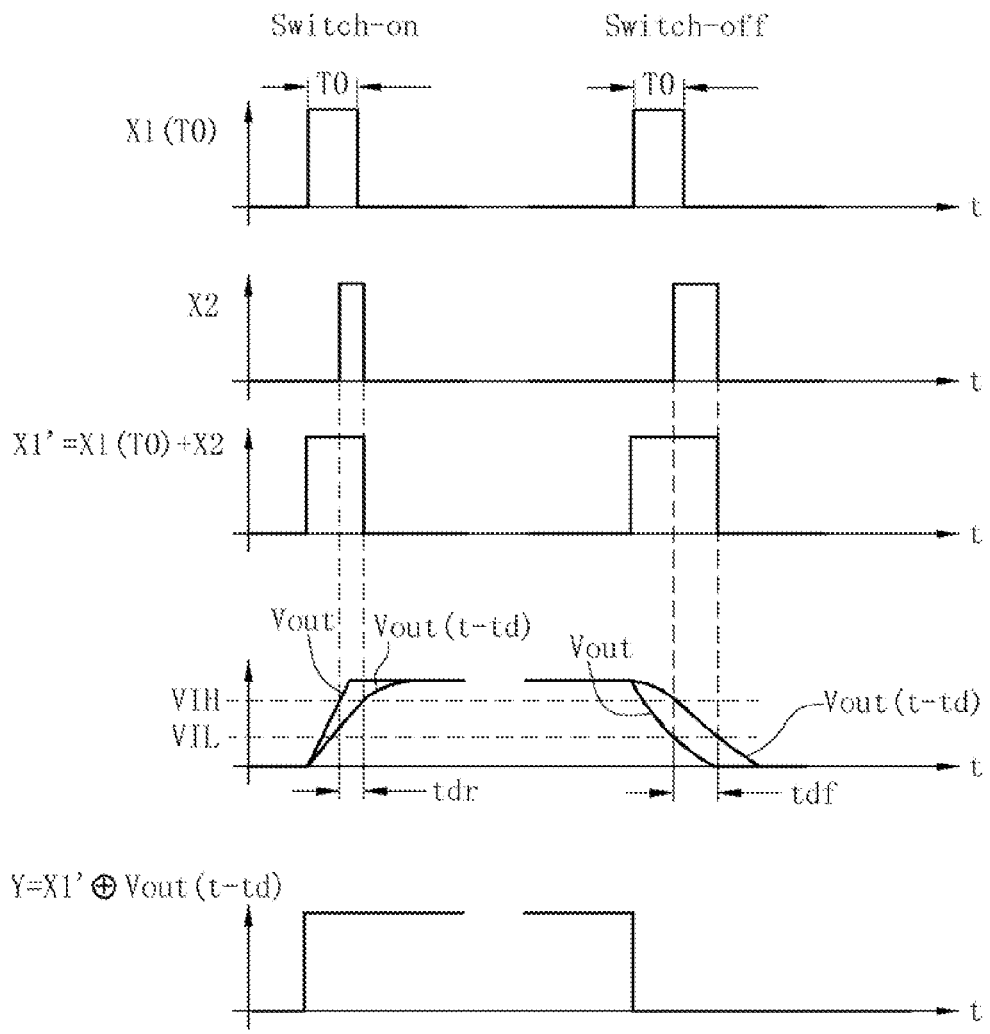
FIG. 2 is a sequence diagram of the power management device, as shown in FIG. 1, in use.

FIG. 2 shows sequences of above pulse signal X1(T0), first control signal X2, second control signal X1', output voltage Vout, delay voltage Vout(t−td), and enabling signal Y in use of the power management device 100. When the power management device 100 and the power supply 20 is off, all the input ends and output ends of the first logic gate 40, the second logic gate 50, and the third logic gate 60 are logic 0. When the power management device 100 is used, the switch 10 is operated to connect the power supply 201 to the pulse generator 20. The pulse generator 20 receives a working voltage from the power supply 201 and correspondingly generates the pulse signal X1(T0), wherein T0 is the value of the pulse width of the pulse signal X1(T0). The pulse signal X1(T0) makes the input end of the second logic gate 50 connected to the pulse generator 20 to temporarily be logic 1. Correspondingly, the output end of the second logic gate 50 generates the second control signal X1', and the voltage of the second control signal X1' is also logic 1. The second control signal X1' is transmitted to the input end of the third logic gate 60 that is connected to the output end of the second logic gate 50, and makes the input end of the third logic gate 60 to be logic 1. The two input ends of the third logic gate 60 being respectively logic 1 and logic 0 makes the voltage of the enabling signal Y generated at the output end of the third logic gate 60 to be logic 1. Upon identifying the voltage of the enabling signal Y as logic 1, the voltage regulator 202 is enabled, and an electronic device (not shown) configured for receiving electric power from the output end Out is switched on.

After the voltage regulator 202 is enabled, the voltage regulator 202 receives the voltage of the power supply 201 and transforms the received voltage of the power supply 201 into the output voltage Vout generated on the output end Out. The output voltage Vout can be used to supply power of the power supply 201 to the electronic device, and is also received by the both the input end of the first logic gate 40 directly connected to the output end Out and the delay unit 30. The first diode 311 is switched on by the output voltage Vout, and the switch-on delay module 31 delays the output voltage Vout and correspondingly generates the delay voltage Vout(t−td). The input end of the first logic gate 40 connected to the delay unit 30 receives the delay voltage Vout(t−td).

As a working voltage of common electronic devices, the value of the output voltage Vout is generally greater than logic input voltages of most logic gates, such as the first logic gate 40. Therefore, in this embodiment, the value of the output voltage Vout can exceed the switch-on value VIH, and thus the input end of the first logic gate 40 directly connected to the output end Out becomes logic 1. Due to the delay process of the switch-on delay module 31, the value of the delay voltage Vout(t−td) increases more slowly than the value of the output voltage Vout. During a predetermined first delay time tdr of the switch-on delay module 31, the value of the output voltage Vout will exceed the switch-on value VIH (i.e., becomes logic 1), while the value of the delay voltage Vout(t−td) is still less than the switch-on value VIH (i.e., stays at logic 0). Thus, the two input ends of the first logic gate 40 are respectively logic 1 and logic 0, and the voltage of the first control signal X2 generated at the output end of the first logic gate 40 is logic 1. Correspondingly, the second control signal X1' generated at the output end of the second logic gate 50 is logic 1. The two input ends of the third logic gate 60, which respectively receives the second control signal X1' and the delay voltage Vout(t−td), being respectively logic 1 and logic 0 makes the voltage of the enabling signal Y to be logic 1. In this way, the voltage regulator 202 stays enabled during the first delay time tdr.

After the first delay time tdr, the value of the delay voltage Vout(t−td) also exceeds the switch-on value VIH (i.e., becomes logic 1). Both the two input ends of the first logic gate 40 are logic 1, and the voltage of the first control signal X2 becomes logic 0. Furthermore, the input end of the third logic gate 60 that receives the delay voltage Vout(t−td) is logic 1. Accordingly, to keep the voltage regulator 202 enabled, the enabling signal Y should be kept at logic 1, and thus the second control signal X1' should become logic 0 after the first delay time tdr. Since the first control signal X2 becomes logic 0 after the first delay time tdr, it can be inferred that if the pulse signal X1(T0) can end during the first delay time tdr, the second control signal X1' can become logic 0 after the first delay time tdr, and thus the enabling signal Y remains logic 1 after the first delay time tdr. Therefore, in this embodiment, the pulse signal X1(T0) is set to end during the first delay time tdr by means of regulating the values of T0 and the first delay time tdr, such that the above functions are achieved.

In the aforementioned operations, when the pulse generator 20 has generated the pulse signal X1(T0), the switch 10 disconnects the power supply 201 from the pulse signal 20 by any usual means known to someone of ordinary skill in the art (e.g., rebounding structure), and prepares to connect the power supply 201 to the pulse signal 20 again and generate a next pulse signal X1(T0) for disabling the voltage regulator 202. Even if the switch 10 does not quickly disconnect the power supply 201 from the pulse signal 20 (e.g., due to being worn out, or errors in operations), since the pulse signal X1(T0) has ended during the first delay time tdr to keep the voltage regulator 202 enabled, as detailed above, the electrical connection between the power supply 201 and the pulse generator 20 does not affect the enabled status of the voltage regulator 202.

When the voltage regulator 202 has been enabled and the switch 10 has disconnected the power supply 201 from the pulse signal 20, the switch 10 can be operated to electrically connect the power supply 201 to the pulse signal 20 again to disable the voltage regulator 202 and turn off the electronic device receiving electric power from the output end Out. Also referring to FIG. 2, when the switch 10 electrically connects the power supply 201 to the pulse signal 20 again, the pulse generator 20 generates another pulse signal X1(T0). The pulse signal X1(T0) makes the input end of the second logic gate 50 connected to the pulse generator 20 to temporarily be logic 1. Correspondingly, the second control signal X1' becomes logic 1, and both the two input ends of the third logic gate 60 being logic 1 makes the enabling signal Y to be logic 0. Thus, the voltage regulator 202 is disabled and the electronic device is switched off.

When the voltage regulator 202 is disabled, the output voltage Vout quickly decreases. The delay voltage Vout(t−td) switches the second diode 331 on and is transmitted to the output end Out (i.e., logic 0) to be canceled through the switch-off delay module 33. Due to the delay process of the switch-off delay module 33, the value of the delay voltage Vout(t−td) decreases more slowly than the value of the output voltage Vout. During a predetermined second delay time tdf of the switch-off delay module 33, the value of the output voltage Vout will become less than the switch-off value VIL (i.e., becomes logic 0), while the value of the delay voltage Vout(t−td) is still greater than the switch-off value VIL (i.e., stays at logic 1). Thus, the two input ends of the first logic gate 40 are respectively logic 1 and logic 0, and the voltage of the first control signal X2 is logic 1. Correspondingly, the second control signal X1' is logic 1. Both the two input ends of the third logic gate 60, which receiving the voltages of the second control signal X1' and the delay voltage Vout(t−td), being logic 1 makes the voltage of the enabling signal Y to be logic 0. In this way, the voltage regulator 202 stays disabled during the second delay time tdf.

After the second delay time tdf, the value of the delay voltage Vout(t−td) is also less than the switch-off value VIL (i.e., becomes logic 0). Thus, both the two input ends of the first logic gate 40 are logic 0, and the voltage of the first control signal X2 becomes logic 0. Furthermore, the input end of the third logic gate 60 that receives the delay voltage Vout(t−td) is logic 0. Accordingly, for keeping the voltage regulator 202 disabled, the enabling signal Y should stay at logic 0, and therefore the second control signal X1' should become logic 0 after the second delay time tdf. Since the first control signal X2 becomes logic 0 after the second delay time tdf, it can be inferred that if the pulse signal X1(T0) can end during the second delay time tdf, the second control signal X1' can become logic 0 after the second delay time tdf, and thus the enabling signal Y can stay at logic 0 after the second delay time tdf. Therefore, in this embodiment, the pulse signal X1(T0) is set to end during the second delay time tdf by means of regulating the values of T0 and the second delay time tdf, such that the above functions are achieved.

In the aforementioned operations, when the pulse generator 20 has generated the pulse signal X1(T0), the switch 10 disconnects the power supply 201 from the pulse signal 20 by any usual means known to someone of ordinary skill in the art (e.g., rebounding structure), and prepares to connect the power supply 201 to the pulse signal 20 again and generate a next pulse signal X1(T0) for enabling the voltage regulator 202 (i.e., according to above detailed enabling operations). Even if the switch 10 does not quickly disconnect the power supply 201 from the pulse signal 20 (e.g., due to being worn out, or errors in operations), since the pulse signal X1(T0) has ended during the second delay time tdf to keep the voltage regulator 202 enabled, as detailed above, the electrical connection between the power supply 201 and the pulse generator 20 does not affect the disabled status of the voltage regulator 202.

In the present disclosure, the pulse generator 20 and the delay unit 30 are used to enable and disable the voltage regulator 202 according to predetermined sequences. As detailed above, the pulse width (e.g., T0) of the pulse signals generated by the pulse generator 20 and the delay times (e.g., tdr, tdf) of the delay unit 30 are regulated to ensure that each pulse signal generated by the pulse generator 20 ends during a corresponding delay time (e.g., tdr, tdf). Even if the switch 10 does not disconnect the pulse generator 20 from the working power supplies thereof (e.g., the power supply 201) in time, the enabled and disabled statuses of the voltage regulator 202 are not affected by the electric connections between the pulse generator 20 and the working power supplies. The power management device 100 does not need expensive microcontrollers (MCUs), and can overcome common shortcomings of mechanical switch devices (e.g., as detailed in the Description of Related Art).

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A power management device for controlling a power supply device, comprising:
   a pulse generator that generates a pulse signal;
   a delay unit connected to the power supply device to receive an output voltage of the power supply device and correspondingly generate a delay voltage;
   a first XOR gate, two input ends of the first XOR gate respectively connected to the power supply device and the delay unit to receive the output voltage and the delay voltage, thereby generating a first control signal on an output end of the first XOR gate;
   an OR gate, two input ends of the OR gate respectively connected to the pulse generator and the output end of the first XOR gate to receive the pulse signal and the first control signal, thereby generating a second control signal on an output end of the OR gate; and
   a second XOR gate, two input ends of the second XOR gate respectively connected to the output end of the OR gate and the delay unit to receive the second control signal and the delay voltage, thereby generating an enabling signal on an output end of the second XOR gate; the output end of the second XOR gate connected to the power supply device, and the enabling signal controlling the power supply device to be enabled and disabled.

2. The power management device as claimed in claim 1, wherein when the power supply device has been disabled and the pulse generator receives a working voltage, the pulse generator generates the pulse signal with a voltage of logic 1; the pulse signal makes the input end of the OR gate connected to the pulse generator to be logic 1, and thus the OR gate generates the second control signal with a voltage of logic 1; the second control signal makes the input end of the second XOR gate connected to the output end of the OR gate to be logic 1, and thus the second XOR gate generates the enabling signal with a voltage of logic 1; the enabling signal with the voltage of logic 1 enables the power supply device.

3. The power management device as claimed in claim 2, wherein when the power supply device is enabled, the output voltage makes the input end of the first XOR gate connected to the power supply device to be logic 1, and the delay unit delays the output voltage and generates a delay voltage transmitted to the input end of the first XOR gate connected to the delay unit and the input end of the second XOR gate connected to the delay unit.

4. The power management device as claimed in claim 3, wherein the delay voltage stays at logic 0 during a predetermined first delay time due to the delay process of the delay unit, and becomes logic 1 after the first delay time.

5. The power management device as claimed in claim 4, wherein during the first delay time, the two input ends of the first XOR gate are respectively logic 1 and logic 0, and thus the first XOR gate generates the first control signal with a voltage of logic 1; the first control signal with the voltage of logic 1 makes the OR gate to generate the second control signal with the voltage of logic 1, and the two input ends of the second XOR gate being respectively logic 1 and logic 0 makes the second XOR gate to generate the enabling signal with the voltage of logic 1, such that the power supply device stays enabled during the first delay time.

6. The power management device as claimed in claim 5, wherein the pulse signal is set to end during the first delay time to ensure that the input end of the OR gate connected to the pulse generator is logic 0 after the first delay time; and thus after the first delay time, both the two input ends of the first XOR gate being logic 1 makes the voltage of the first control signal to become logic 0, both the two input ends of the OR gate being logic 0 makes the OR gate to generate the second control signal with the voltage of logic 0, and the two input ends of the second XOR gate being respectively logic 1 and logic 0 makes the second XOR gate to generate the enabling signal with the voltage of logic 1, such that the power supply device stays enabled after the first delay time.

7. The power management device as claimed in claim 6, wherein when the power supply device has been enabled and the pulse generator receives the working voltage again, the pulse generator generates the pulse signal with the voltage of logic 1 again; the pulse signal makes the input end of the OR gate connected to the pulse generator to be logic 1, and thus the OR gate generates the second control signal with the voltage of logic 1; both the two input ends of the second XOR gate being logic 1 makes the second XOR gate to generate the enabling signal with a voltage of logic 0; the enabling signal with the voltage of logic 0 disables the power supply device.

8. The power management device as claimed in claim 7, wherein when the power supply device is disabled, the output voltage becomes logic 0, and the delay voltage is canceled through the delay unit, and is delayed by the delay unit during the cancellation process.

9. The power management device as claimed in claim 8, wherein the delay voltage maintains to be logic 1 during a predetermined second delay time due to the delay process of the delay unit, and becomes logic 0 after the second delay time.

10. The power management device as claimed in claim 9, wherein during the second delay time, the two input ends of the first XOR gate are respectively logic 1 and logic 0, and thus the first XOR gate generates the first control signal with a voltage of logic 1; the first control signal with the voltage of logic 1 makes the OR gate to generate the second control signal with the voltage of logic 1, and both the two input ends of the second XOR gate being logic 1 makes the second XOR gate to generate the enabling signal with the voltage of logic 0, such that the power supply device stays disabled during the second delay time.

11. The power management device as claimed in claim 10, wherein the pulse signal is also set to end during the second delay time to ensure that the input end of the OR gate connected to the pulse generator is logic 0 after the second delay time; and thus after the second delay time, both the two input ends of the first XOR gate being logic 0 makes the voltage of the first control signal to become logic 0, both the two input ends of the OR gate being logic 0 makes the OR gate to generate the second control signal with the voltage of logic 0, and both the two input ends of the second XOR gate being logic 0 makes the second XOR gate to generate the enabling signal with the voltage of logic 0, such that the power supply device stays disabled after the second delay time.

12. The power management device as claimed in claim 2, further comprising a switch, the power supply device connected to the pulse generator through the switch; wherein when the switch electrically connects the power supply device to the pulse generator, the power supply device provides the working voltage to the pulse generator.

13. The power management device as claimed in claim 1, wherein the delay unit includes a switch-on delay module, a switch-off delay module, a first diode, and a second diode; the power supply connected to an anode of the first diode through the switch-on delay module, and a cathode of the first diode is connected to the input end of the first XOR gate that is connected to the delay unit; the power supply device also connected to a cathode of the second diode, and an anode of the second diode is connected to the input end of the first XOR gate that is connected to the delay unit through the switch-off delay module.

14. The power management device as claimed in claim 13, wherein when the power supply device is enabled, the output voltage is first delayed by the switch-on delay module, and then switches the first diode on to generate the delay voltage, such that the value of the delay voltage increases more slowly than the value of the output voltage; when the power supply device is disabled, the delay voltage is first delayed by the switch-off delay module, and then switches the second diode on to be canceled, such that the value of the delay voltage decreases more slowly than the value of the output voltage.

* * * * *